United States Patent [19]

Konishi

[11] Patent Number: 5,424,695
[45] Date of Patent: Jun. 13, 1995

[54] ULTRA-WIDE FREQUENCY RANGE CONSTANT PHASE DIFFERENCE POWER DISTRIBUTOR

[75] Inventor: Yoshihiro Konishi, Sagamihara, Japan

[73] Assignee: Uniden Corporation, Uchikawa, Japan

[21] Appl. No.: 135,412

[22] Filed: Oct. 13, 1993

[30] Foreign Application Priority Data

Apr. 30, 1993 [JP] Japan .................. 5-104396

[51] Int. Cl.$^6$ ........................................ H03H 7/48
[52] U.S. Cl. ................................... 333/131; 333/136
[58] Field of Search ............... 333/124, 125, 127, 128, 333/131, 136

[56] References Cited

U.S. PATENT DOCUMENTS 4,789,845 12/1988 Reddy ........................... 333/131 X
5,006,822 4/1991 Reddy ........................... 333/131 X

*Primary Examiner*—Paul Gensler
*Attorney, Agent, or Firm*—Stevens, Davis, Miller & Mosher

[57] ABSTRACT

To avoid deterioration of isolation between two distributed power outputs in higher and lower end portions of an available frequency region of a Wilkinson power distributor, plural stages of ferrite-loaded close-coupled parallel dual lines for providing a Wilkinson power distributor, an electric length of which lines is shortened within a range in which desired isolation can be obtained, are connected in cascade. As a result, two distributed power outputs having a constant phase difference with sufficient isolation throughout an extremely wide frequency range can be obtained.

3 Claims, 8 Drawing Sheets

FIG_1A
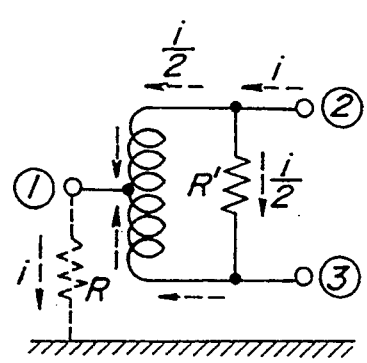
FIG_1B
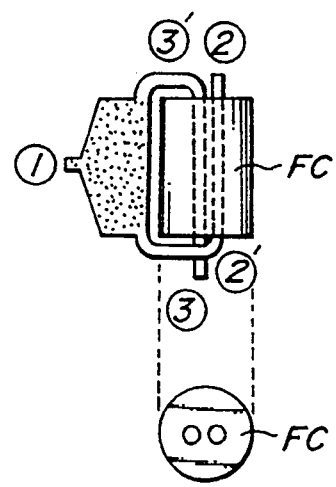
FIG_1C
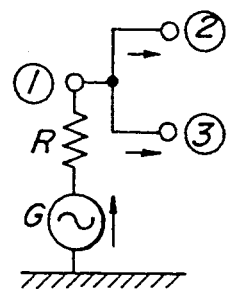
FIG_1D
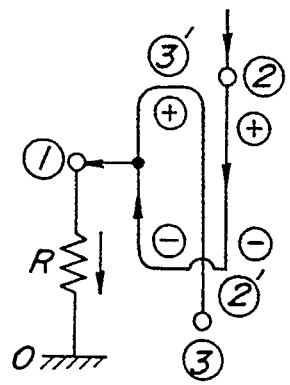

FIG_2
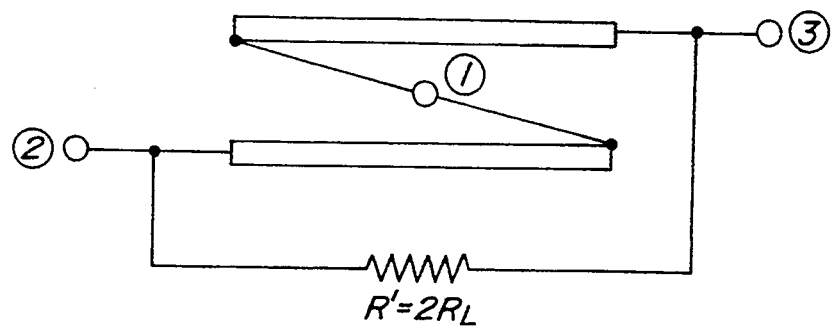
FIG_3A
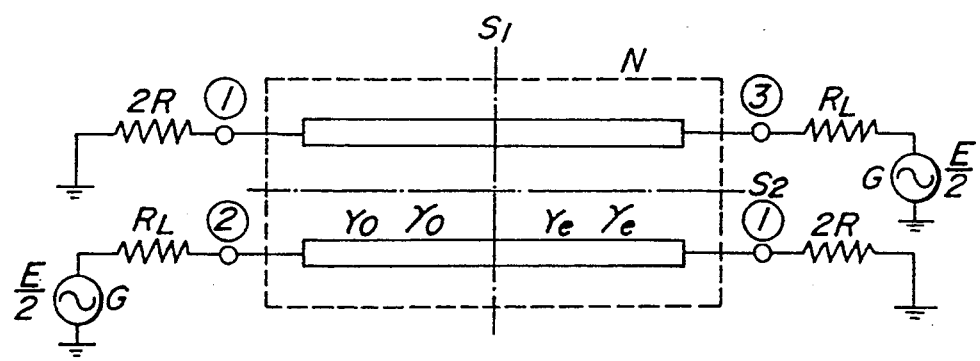
FIG_3B
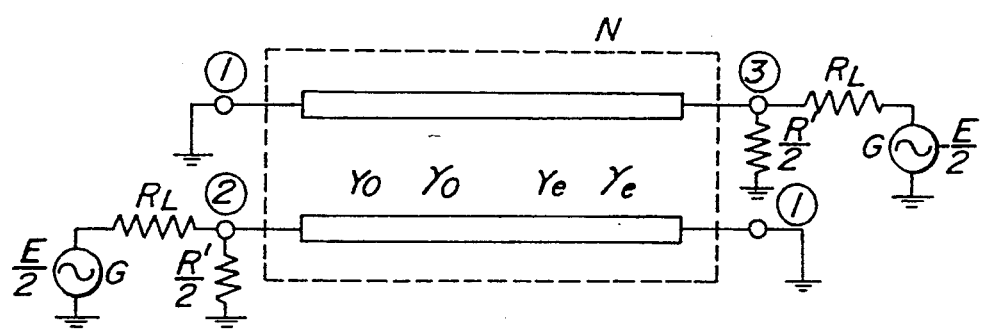

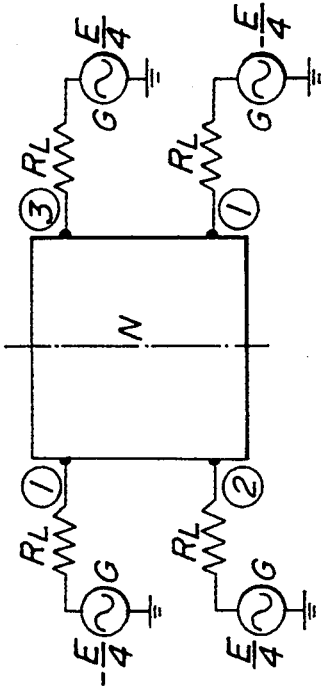
FIG_4A
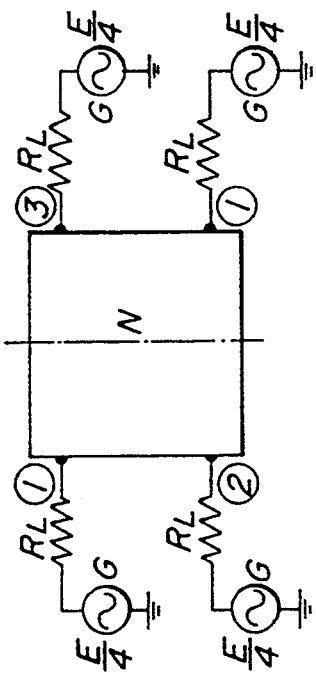
FIG_4B
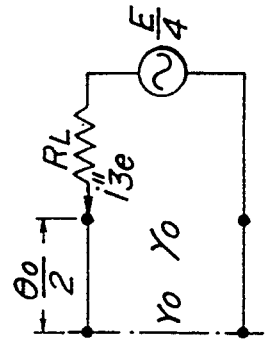
FIG_4C
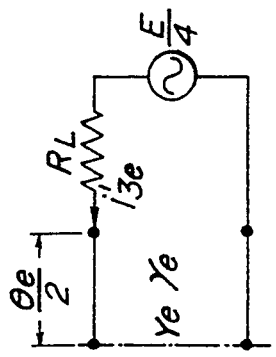
FIG_4D

FIG_6
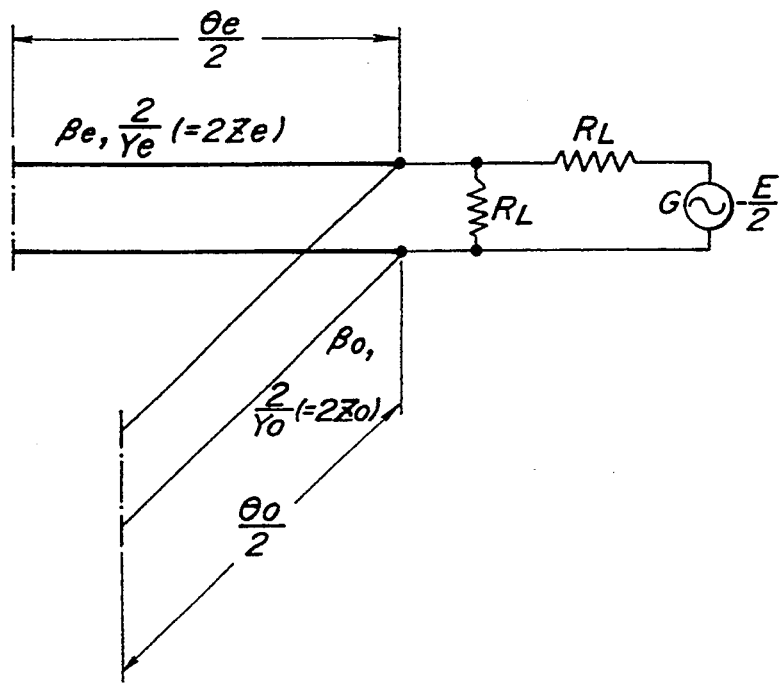
FIG_7A
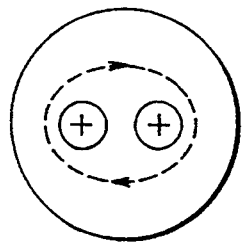
FIG_7B
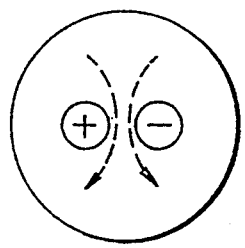

FIG_8A
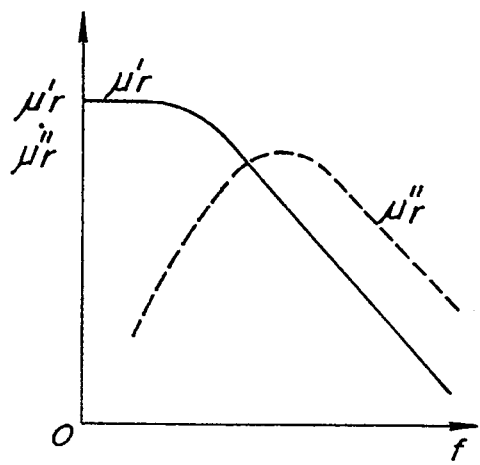
FIG_8B
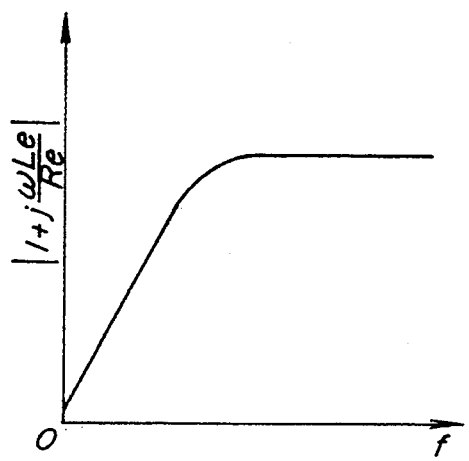
FIG_9
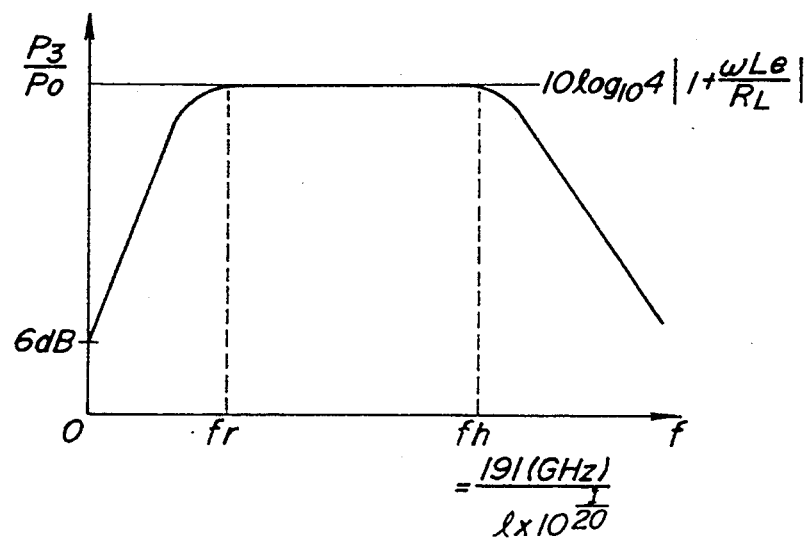

FIG_10
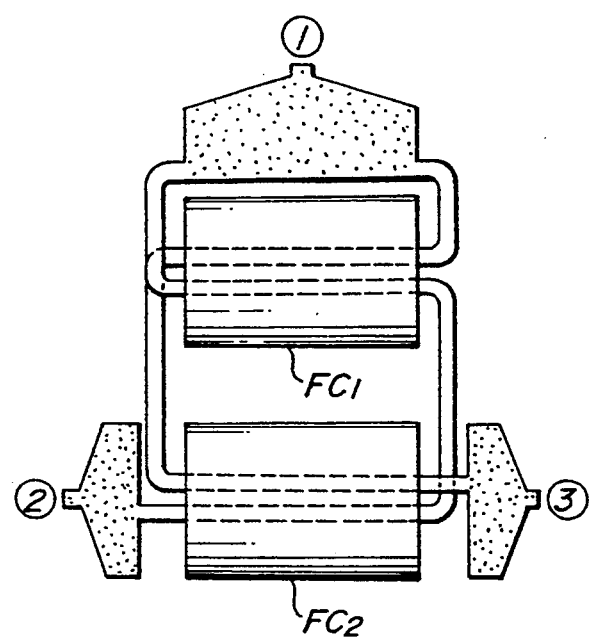

FIG_11
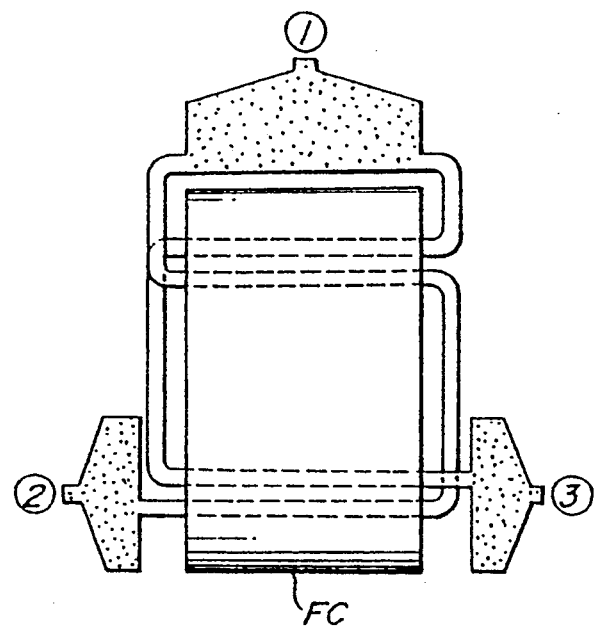

ULTRA-WIDE FREQUENCY RANGE CONSTANT PHASE DIFFERENCE POWER DISTRIBUTOR

BACKGROUND OF THE INVENTION

1. Field of the Invention

The present invention relates to a Wilkinson type high frequency power distributor comprising a ferrite-loaded parallel dual line; and particularly, to an ultra-wide frequency range constant phase difference power distributor for distributing electric powers, having a predetermined mutual phase difference, which presents necessary isolation throughout an extremely wide frequency range exceeding a natural magnetic resonant frequency of ferrite.

2. Related Art Statement

As for the wide frequency range constant phase difference power distributor of this kind, which is principally used in VHF and UHF regions, a power distributor of the Wilkinson type has been conventionally employed. The power distributor of this type has been frequently adopted for communication apparatus, because of its small size, simple structure and constant phase difference distributed power output which can be obtained in a wide frequency range.

However, in the conventional Wilkinson type power distributor, throughout the entire frequency range in which constant phase difference distributed outputs can be obtained, sufficient isolation cannot be obtained between those distributed outputs such that the isolation quality deteriorates in lower and higher portions of the frequency range concerned. Such, it is a conventional problem to be solved to provide a Wilkinson type constant phase difference power distributor with sufficient isolation throughout its operational frequency range.

SUMMARY OF THE INVENTION

An object of the present invention is to provide an ultra-wide frequency range constant phase difference power distributor in which distributed output signal powers, having a predetermined phase difference, can be obtained with sufficient isolation throughout an extremely wide frequency range.

An ultra-wide frequency range constant phase difference power distributor according to the present invention is featured in that, as for a Wilkinson power distributor comprising ferrite-loaded symmetrically close-coupled parallel dual lines, to each one ends on mutually opposite sides of which respective output terminals are allotted and to mutually connected other ends of which an input terminal is allotted, at least two of said power distributors, in which an electric length $\theta$odd in odd mode of said symmetrically close-coupled parallel dual lines is quite small within a range, in which range necessary isolation can be attained between the respective output terminals, are connected in cascade, so as to obtain a constant phase difference distributed output powers throughout an ultra-wide frequency range.

Consequently, in the power distributor of the present invention, the constant phase difference distributed output powers can be obtained with sufficient isolation throughout an extremely wide frequency range exceeding a natural magnetic resonant frequency of ferrite.

BRIEF DESCRIPTION OF THE DRAWINGS

For the better understanding of the invention, reference is made to the accompanying drawings, in which:

FIGS. 1A, 1B, 1C and 1D are diagrams showing a schematic of the principle of an embodiment of the invention, the specific structure of an embodiment of the invention, an equivalent circuit of an embodiment of the invention and the operation of an embodiment of the invention respectively;

FIG. 2 is a diagram showing a schematic of the principle of a close-coupled parallel dual line type Wilkinson power distributor;

FIGS. 3A and 3B are diagrams showing equivalent circuits of close-coupled parallel dual lines excited in an even mode and in an odd mode respectively;

FIGS. 4A, 4B and 4C, 4D are diagrams showing equivalent circuits taken from the even mode excitation equivalent circuit shown in FIG. 3A and equivalent circuits relating to one of the distributed outputs thereof respectively;

FIG. 6 is a diagram showing an equivalent circuit for obtaining a current derived from one of the output terminals of the odd mode excitation equivalent circuit shown in FIG. 3B;

FIGS. 7a and 7B are diagrams showing magnetic fields of close-coupled parallel dual lines excited in even and odd modes respectively;

FIGS. 8A and 8B are graphs showing frequency characteristics of complex permeability and line impedance of the ferrite-loaded parallel dual lines respectively;

FIG. 9 is a graph showing a frequency characteristic of the isolation between two distributed output powers of the Wilkinson power distributor comprising ferrite-loaded close-coupled parallel dual lines;

FIG. 10 is a diagram showing the concrete structure of a Wilkinson power distributor according to the present invention; and FIG. 11 is a diagram showing another embodiment of the invention.

DESCRIPTION OF THE PREFERRED EMBODIMENTS

Figure 5A:
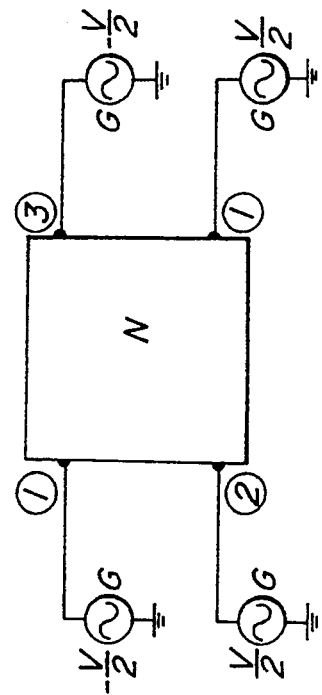
FIGS. 5A and 5B are diagrams showing equivalent circuits taken from the odd mode excitation equivalent circuit shown in FIG. 3B respectively.

Preferred embodiments of the present invention will be described in detail by referring to the accompanying drawings hereinafter.

The Wilkinson type power distributor, which is a wide frequency range constant phase difference power distributor frequently employed in communication apparatus, is mainly used for dual distribution and hence is arranged as shown in FIG. 1A. An input signal supplied to a terminal ① is divided into two output signals, which are derived from terminals ② and ③, according to an equivalent circuit, as shown in FIG. 1C.

As for the condition that when a signal is applied onto the terminal ② no signal appears at the terminal ③, the resistor R' connected between terminals ② and ③, should be twice the internal resistance R of the signal source G. In this case, current directions and magnitudes flowing through several portions of the equivalent circuit present are as indicated by the dotted arrows in FIG. 1A.

The thus composed Wilkinson type power distributor can be arranged in a form of a ferrite-loaded power distributor, as shown in FIG. 1B, by connecting each end point of the parallel dual lines, which points are opposite to the output terminals ② and ③ respectively, with the input terminal ①, after the mutually close-coupled parallel dual lines are loaded with a ferrite core FC in which real and imaginary parts $\mu'$ and $\mu''$ of the complex permeability have the relation $\mu' \geq \mu''$ therebetween.

When a signal is supplied to the input terminal ① of the thus arranged power distributor, currents having the same magnitude in mutually opposite directions flow in the parallel dual lines penetrating through the central portion of the ferrite core FC. Thus, no magnetic field is generated in the ferrite core FC and hence the input signal power is dually distributed according to the equivalent circuit shown in FIG. 1C.

On the other hand, in the case that a signal is supplied to the terminal ② in the arrangement shown in FIG. 1B and hence a current i flows into the terminal ② as shown in FIG. 1D, a voltage drop iZ is caused across the line ② to ②' having an impedance Z. As a result, the same voltage drop iZ is caused across the other line ③' to ③ closely coupled therewith also.

When a voltage drop caused between a certain terminal i and another terminal j in FIG. 1B or 1D is denoted by $V_{i-j}$, the following relation can be attained in FIG. 1B or 1D.

$$V_{3-0} = V_{1-0} + V_{3-3'} = iR - iZ$$

Thus, when the line impedance Z is a pure resistance, the signal supplied to the terminal ② does not appear at the terminal ③.

In this regard, as for the complex permeability $\mu$ of ferrite, the aforesaid relation $\mu' \geq \mu''$ exists, and further the imaginary part $\omega\mu''$ of the impedance Z of the ferrite-loaded line takes a constant value regardless of the frequency in the frequency range exceeding the natural magnetic resonant frequency $f_r$. Thus, a sufficient isolation can be obtained between output terminals ② and ③ in FIGS. 1B or 1D.

However, each of the terminal impedances in the arrangement shown in FIG. 1A is conventionally equalized to the other by connecting a wire-wound transformer having a transformation ratio $\sqrt{2}$:1 with the terminal ①. Thus, in this conventional case, the line impedance Z is not pure resistance, but contains a reactance component based on the inductance of the transformer.

However, when the ferrite core FC is applied on this transformer, the aforesaid reactance component becomes independent of frequency as mentioned before. Thus, sufficient isolation can be expected through the coincidence of impedances between the transformer and the distributed lines in an extremely wide frequency range. For instance, isolation exceeding 22 dB at a standing wave ratio less than 1.3 throughout the frequency range from 50 MHz to 1,100 MHz can be expected through the power distributor formed by depositing close-coupled parallel dual lines on a ferrite substrate. In this regard, the frequency range, in which sufficient isolation can be obtained between distributed outputs of thus ferrite-loaded power distributor, can be further widened into an extremely wide frequency range through a procedure described hereinafter in detail.

The close-coupled parallel dual lines forming the Wilkinson type power distributor shown in FIG. 1B presents rotational symmetry regarding a symmetry axis at the terminal ① as shown in FIG. 2. Thus, specific vectors, which excite the dual terminal circuit provided with two terminals ② and ③ in a state that a load resistance R is connected with the terminal ①, belong to even and odd modes, respectively.

These specific vector excitations in even and odd modes become respectively as shown in Table 1.

TABLE 1

|  | Even Mode | Odd Mode | Total |
|---|---|---|---|
| Terminal ② | E/2 | E/2 | E |
| Terminal ③ | E/2 | −E/2 | O |

Thus, a total of even and odd mode excitations is equal to an electro-motive force E applied onto the terminal ② and hence equivalent circuits corresponding to the even and odd mode excitations respectively can be arranged as shown in FIGS. 3A and 3B respectively.

In the equivalent circuit corresponding to the even mode excitation as shown in FIG. 3A, a load resistance R to be connected with the terminal ① can be formed by a parallel connection of two resistances 2R, so that, each terminal ① of the parallel dual lines is individually connected with the respective load resistance 2R. On the other hand, in the equivalent circuit corresponding to the odd mode excitation in FIG. 3B, these terminals ① are directly earthed (grounded).

Under the investigation of the quadruple terminal circuit N, which is formed of the parallel dual lines as indicated by being surrounded with dotted lines in the equivalent circuits as shown in FIGS. 3A and 3B, under the following condition (1) regarding the signal source internal resistance $R_L$ and the load resistance R, $$2R = R_L \qquad (1)$$

the quadruple terminal circuit N is symmetric with regard to symmetry planes $S_1$ and $S_2$ as indicated by chain lines in FIG. 3A, respectively.

Thus, the arrangement corresponding to the even mode excitation shown in FIG. 3A can be dealt with as a sum total of the excitation arrangements as shown in FIGS. 4A and 4B respectively. Consequently, to obtain the current flowing through the terminal ③ in the equivalent circuit shown in FIG. 3A, it is enough to mutually add currents $i'_{3e}$ and $i''_{3e}$ which are obtained respectively as for the equivalent circuits shown in FIGS. 4C and 4D, respectively in relation to the terminal ③ in the equivalent circuits shown in FIGS. 4A and 4B.

Figure 5B:
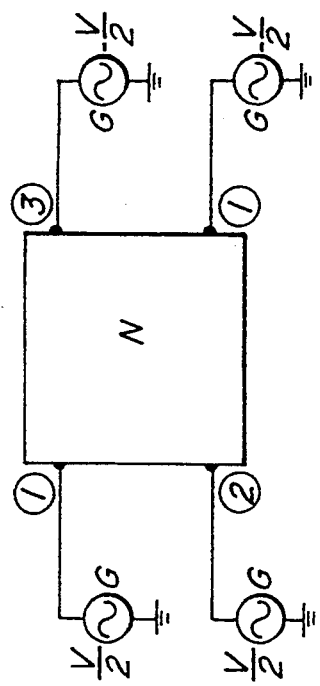

On the other hand, when the voltages applied onto the terminals ② and ③ in the equivalent circuit shown in FIG. 3B with regard to the odd mode excitation are denoted by V and −V respectively, the equivalent circuit shown in FIG. 3B corresponds to the composition of the equivalent circuits shown in FIGS. 5A and 5B. Thus, an admittance of the circuit N viewed from the terminal ③ corresponds to an admittance of a distributed constant circuit having a characteristic admittance Ye of end-short-circuited lines and a characteristic admittance Yo of end-opened lines in equivalent circuits shown in FIGS. 5A and 5B respectively.

When currents flowing through the terminal ③ in each of the above-mentioned cases are denoted by $i'_{3o}$ and $i''_{3o}$, the following equations are obtained.

$$i'_{3o} = (-V/2)/\{(j(1/Ye)\tan(\theta e/2)\}$$

$$i''_{3o} = (-V/2)/\{(-j(1/Ye)\cot(\theta o/2)\}$$

In the case that the admittance of the circuit N viewed from the terminal ③ is denoted by Yo, when the voltage −V is applied onto the terminal ③ in the equivalent circuit shown in FIG. 3B, the following equation (2) is obtained.

$$Y_o = (i'_{3o} + i''_{3o})/(-V) \qquad (2)$$
$$= 1/\{j(2/Y_e)\tan(\theta_e/2)\} + 1/\{-j(2/Y_o)\cot(\theta_o/2)\}$$

Thus, an equivalent circuit provided for obtaining a current $i_3$ flowing through the terminal ③ in the equivalent circuit as shown in FIG. 3B becomes shown in FIG. 6.

Consequently, the current $i_3$ flowing through the terminal ③ connected with the load resistance $R_L$ in response to the electro-motive force, which is applied on the terminal ② of the close-coupled parallel dual lines as shown in FIG. 2 through the internal source impedance $R_L$, can be obtained by the following equation (3).

$$i_3 = i'_{3e} + i''_{3e} + i_{3o} \qquad (3)$$

For example, in the case that $Y_e \geq Y_o$, $$i'_{3e} = 0$$
$$i''_{3e} = (E/4R_L) \cdot 1/\{1 + j \cdot 1/(Y_o R_L)\tan(\theta_o/2)\}$$
$$= (E/4R_L) \cdot [1 - \{j(K\alpha/2)/(1 + j(K\alpha/2))\}]$$

where,
$K = 2/(Y_o R_L)$
$\alpha = \tan(\theta_o/2)$

Furthermore, according to the equivalent circuit shown in FIG. 6, $$i_{3o} \simeq -\frac{E}{2} \cdot \cfrac{1}{R_L + \cfrac{1}{\cfrac{1}{R_L} + j\cfrac{Y_o}{2}\tan\cfrac{\theta_o}{2}}} =$$

$$-\frac{E}{4R_L}\left[1 + \cfrac{j\cfrac{\alpha}{2K}}{1 + j\cfrac{\alpha}{2K}}\right]$$

So that, $$i_3 = \frac{E}{8R_L} \cdot \cfrac{j\left[K + \cfrac{1}{K}\right]\alpha}{1 + j\cfrac{K\alpha}{2}}$$

As a result, the ratio of the maximum available power $P_0$, which is based on the electro-motive force E applied on the terminal ②, to the power $P_3$ appearing at the terminal ③ can be expressed as follows.

$$P_0/P_3 = 16\{1 + (K\alpha/2)^2\}/\{K + 1/K\}^2\alpha^2\}$$

Accordingly, the isolation I between the terminals ② and ③ can be expressed by the following equation (5).

$$I(\text{dB}) = 10\log_{10}(P_0/P_3) = 20\log_{10}\cfrac{4\sqrt{1 + \left[\cfrac{K\alpha}{2}\right]^2}}{\left[K + \cfrac{1}{K}\right]\alpha} \text{ (dB)} \qquad (5)$$

In this regard, the relation $Y_e \geq Y_o$ exists between the characteristic admittances Ye and Yo in the even and odd modes respectively, and further in case that the relation $\theta_0 \geq 1$ is sustained as for the line electric length in the odd mode, the following conditions are maintained.

$$\alpha \simeq -\theta_o/2, \alpha^2 \geq 1$$

Accordingly, when these conditions are substituted into the equation (5), the following equation (6) is obtained.

$$I(\text{dB}) = 20\log_{10}\cfrac{8}{\left[K + \cfrac{1}{K}\right]\theta_o} \text{ (dB)} \qquad (6)$$

The maximum isolation $I_{max}$, which is obtained when it is assumed that K=1, that is, $2Z_o = R_L$ and $Z_o = 1/Y_o$, can be expressed by the following equation (7).

$$I_{max}(\text{dB}) = 20\log_{10}(4/\theta_o) \text{ (dB)} \qquad (7)$$

For example, the odd mode electric length $\theta_o$ required for obtaining the isolation exceeding 30 dB can be obtained according to the equation (7) as follows.

$$\theta_o > 0.12 \text{ } (radian) = 7.25 \text{ } degrees$$

So that, the distance in vacuum, for instance, at the frequency 2 GHz becomes 3.02 mm.

On the other hand, in the case that the relation $\theta_o \geq 1$ is sustained as for the line electric length in the even mode, the following condition is maintained, because the operation in the odd mode is scarcely affected by the specific permeability of the medium consisting, for instance, of ferrite in comparison with the operation in the even mode.

$$\theta_o \geq \theta_e \geq 1$$

So that, $$i'_{3e} \simeq 0$$

$$i''_{3e} = \frac{E}{4R_L} \cdot \cfrac{1}{1 + j\cfrac{K\alpha}{2}} = \frac{E}{4R_L}\left\{1 - \cfrac{j\cfrac{K\alpha}{2}}{1 + j\cfrac{K\alpha}{2}}\right\}$$

In this regard, according to the equivalent circuit shown in FIG. 6, the following equation is obtained.

$$i_{3o} = -\frac{E}{2} \cdot \cfrac{1}{R_L + \cfrac{1}{\cfrac{1}{R_L} - j\cfrac{Y_e}{2}\cot\cfrac{\theta_e}{2}}} \simeq$$

-continued $$-\frac{E}{4R_L}\left(1 + \frac{1}{1 + j\frac{2\theta e}{Y_e R_L}}\right) \quad (5)$$

Consequently, the following equation can be obtained.

$$i_3 = -\frac{E}{4R_L}\left\{\frac{j\frac{\theta o}{2Y_o R_L}}{1 + j\frac{\theta o}{2Y_o R_L}} + \frac{1}{1 + j\frac{2\theta e}{Y_e R_L}}\right\} \quad (8)$$

When an inductance and a capacitance per unit length of the distributed constant lines are denoted by L and C respectively and further are suffixed with e and o corresponding to the even mode and the odd mode respectively, the following equations (9) are obtained as for the line electric length and the line admittance respectively.

$$\left.\begin{array}{l}\theta_{e,o} = \omega\sqrt{L_{e,o} \cdot C_{e,o}} \\ \frac{1}{Y_{e,o}} = \sqrt{\frac{L_{e,o}}{C_{e,o}}}\end{array}\right\} \quad (9)$$

As a result, the following equation (10) can be obtained.

$$\frac{\theta_{e,o}}{Y_{e,o} \cdot R_L} = \frac{\omega L_{e,o}}{R_L} \quad (10)$$

On the other hand, magnetic fields in the even mode and in the odd mode of the close-coupled parallel dual lines become as shown in FIGS. 7A and 7B respectively, so that the relation $Lo \geqq Le$ is established. As a result, the aforesaid equation (8) can be simplified as follows.

$$i_3 = \frac{-E}{4R_L} \cdot \frac{1}{1 + j\frac{2\omega Le}{R_L}}$$

Consequently, the output power $P_3$ appearing at the terminal ③ becomes as follows.

$$P_3 = i_3^2 R = \frac{E^2}{16R_L} \cdot \frac{1}{\left|1 + j\frac{2\omega Le}{R_L}\right|^2}$$

At the same time, the maximum available power $P_0$ of the electro-motive force E applied on the terminal ② becomes as follows.

$$P_o = \frac{E^2}{4R_L}$$

Accordingly, the following relation can be obtained.

$$P_o/P_3 = 4\left|1 + j\frac{2\omega Le}{R_L}\right|^2$$

As a result, the isolation expressed by the equation (5) can be expressed by the following equation 11 also.

$$I(\text{dB}) = 10\log_{10}(P_o/P_3) = 20\log_{10}2\left|1 + j\frac{2\omega Le}{R_L}\right|(\text{dB}) \quad (11)$$

On the other hand, when the complex specific permeability of ferrite is expressed by the following equation, $$\mu_r \mu'_r - j\mu''_r$$

the real part $\mu'r$ and the imaginary part $\mu''r$ thereof have respective frequency characteristics as shown in FIG. 8A in general. Thus, the absolute value $|\omega Le|$ of the even mode impedance presents a frequency characteristic shown in FIG. 8B. As a result, in the lower frequency range, the line impedance in the even mode is lowered, so that, according to the equation (11), sufficient isolation cannot be obtained.

On the other hand, in the higher frequency range, the relative phases between the currents flowing in the mutually opposite directions through the close-coupled parallel dual lines become just opposite to each other at the midpoint of the parallel dual lines, whereas the deviation from the opposite phase is increased in response to the increase of the distance from the midpoint and further in response to the increase of the line length itself. As a result, the currents flowing in the mutually opposite directions cannot be perfectly cancelled with each other, and hence the deterioration of the isolation based on the equation (6) is caused.

In this regard, in the intermediate frequency range, as is apparent from FIG. 8B, the value $|1+j(2\omega Le)/Re|$ is maintained at a constant, so that, isolation is maintained at a constant also, as shown in FIG. 9.

In the conventional Wilkinson power distributor formed of ferrite-loaded close-coupled parallel dual lines as shown in FIG. 1B, even within the frequency range in which two distributed outputs having a desired phase difference therebetween can be obtained, the isolation between the two distributed outputs has been conventionally deteriorated in the higher and the lower ranges thereof.

In this regard, the deterioration of the isolation in the higher frequency range can be prevented by shortening the axial length of the ferrite core loaded on the close-coupled parallel dual lines as shown in FIG. 1B, by shortening the even mode electric length $\theta e$ of the close-coupled parallel dual lines, and further by reducing the electric length of the close-coupled parallel dual lines, in which length the odd mode electric length $\theta o$ has the relation $\theta o \geqq \theta e$, so as to reduce the phase deviation between the currents flowing in the mutually opposite directions in the odd mode.

On the other hand, as for the reduction from the required value of the phase difference between two distributed outputs, which is consequent upon the electric length reduction of the parallel dual lines in the Wilkinson power distributor, and as for the deterioration of the isolation in the lower frequency range, which is based on the reduction of the even mode impedance, plural blocks (i.e. at least two blocks) of the ferrite-loaded parallel dual lines having the shortened electric length are connected in cascade, so as to obtain the required phase difference between the two distributed outputs and further so as to prevent the deterioration of the isolation in the lower frequency range.

In this connection, each block of the parallel dual lines to be connected in cascade is preferably connected to an other through transmission lines respectively, so as to prevent mutual affections therebetween upon respective properties of each block.

The power distributor formed of the thus arranged ferrite-loaded close-coupled parallel dual lines can be provided by connecting in cascade plural blocks of power distributors formed of close-coupled parallel dual lines penetrating central portions of ferrite beads, namely, cylindrical ferrite blocks, as well as by depositing in cascade, plural pairs of close-coupled parallel dual lines having a shortened electric length on a ferrite substrate appropriately apart from each other and further by depositing transmission lines for connecting each pair of dual lines in cascade on the same ferrite substrate in common. For example, as shown in FIG. 10, two power distributors are connected in cascade. The parallel lines penetrate central portions of ferrite cores FC1 and FC2. Alternatively, only one core may be used as shown in FIG. 11.

As is apparent from the above description, according to the present invention, the conventionally caused deterioration of isolation between two distributed outputs of a Wilkinson power distributor, which is frequently employed in communication apparatus, in higher and lower end portions of the frequency region, in which those two distributed outputs having a necessary phase difference therebetween can be obtained, can be removed through a simple improvement of the arrangement thereof. As a result, an evident effect of the present invention is to provide two distributed power outputs provided with sufficient isolation therebetween throughout an extremely wide frequency range.

What is claimed is:

1. An ultra-wide frequency range constant phase difference power distributor system comprising:
    a first Wilkinson power distributor comprising a first pair of ferrite-loaded symmetrically close-coupled parallel lines, first ends of said first pair of lines being connected in common to an input terminal, and second ends of said first pair of lines defining first and second connection terminals; and
    a second Wilkinson power distributor comprising a second pair of ferrite-loaded symmetrically close-coupled parallel lines, first ends of said second pair of lines being connected respectively to said first and second connection terminals, and second ends of said second pair of lines defining first and second output terminals; wherein:
    said first and second Wilkinson power distributors are connected in cascade,
    an electric length $\theta$odd of said first and second pairs of lines, during odd mode operation, is selected, by shortening an axial length of a ferrite core loaded on said symmetrically close-coupled parallel lines, to provide a desired isolation factor I between said first and second terminals, and
    said electric length $\theta$odd and said desired isolation factor I satisfy the equation:

$$I\ (\text{dB}) = 20\ \log_{10}(4/\theta\text{odd})\ (\text{dB}).$$

2. A system according to claim 1, further comprising a first ferrite core and a second ferrite core,
    wherein said first pair of lines is disposed in said first ferrite core and said second pair of lines is disposed in said second ferrite core.

3. An ultra-wide frequency range constant phase difference power distributor system comprising:
    a ferrite core;
    a first Wilkinson power distributor comprising a first pair of ferrite-loaded symmetrically close-coupled parallel lines, first ends of said first pair of lines being connected in common to an input terminal, and second ends of said first pair of lines defining first and second connection terminals; and
    a second Wilkinson power distributor comprising a second pair of ferrite-loaded symmetrically close-coupled parallel lines, first ends of said second pair of lines being connected respectively to said first and second connection terminals, and second ends of said second pair of lines defining first and second output terminals; wherein:
    at least said first and second pairs of lines are disposed in said ferrite core and are connected in cascade,
    an electric length $\theta$odd of said first and second pairs of lines, during odd mode operation, is selected, by shortening an axial length of said ferrite core, to provide a desired isolation factor I between said first and second terminals, and
    said electric length $\theta$odd and said desired isolation factor I satisfy the equation:

$$I\ (\text{dB}) = 20\ \log_{10}(4/\theta\text{odd})\ (\text{dB}).$$

* * * * *